United States Patent

[11] 3,585,414

[72] Inventor Mario Ghezzo
North Adams, Mass.
[21] Appl. No. 848,241
[22] Filed Aug. 7, 1969
[45] Patented June 15, 1971
[73] Assignee Sprague Electric Company
North Adams, Mass.

[54] CONTINUOUSLY TUNABLE VARACTOR
6 Claims, 3 Drawing Figs.

[52] U.S. Cl. .......... 307/320, 307/299, 317/235
[51] Int. Cl. .......... H03k 3/53, H01l 11/00
[50] Field of Search .......... 317/234, 234/9, 235/9; 307/320

[56] References Cited
UNITED STATES PATENTS

| | | | |
|---|---|---|---|
| 3,022,472 | 2/1962 | Tanenbaum et al. .......... | 317/234 X |
| 3,263,085 | 7/1966 | Rappaport et al. .......... | 317/234 X |
| 3,333,207 | 7/1967 | Bento et al .......... | 317/234 X |
| 3,384,829 | 5/1968 | Sato .......... | 307/320 X |
| 3,390,314 | 6/1968 | Medwin .......... | 317/235 |

*Primary Examiner*—James D. Kallam
*Attorneys*—Connolly and Hutz, Vincent H. Sweeney, James Paul O'Sullivan and David R. Thornton

ABSTRACT: A resistive plate insulatively spaced from a semiconductive body, is adapted for application of potential gradient thereacross such that capacitance between the plate and body varies substantially continuously in accordance with said potential gradient.

CONTINUOUSLY TUNABLE VARACTOR

BACKGROUND OF THE INVENTION

This invention relates to variable capacitors and more particularly to a continuously tunable varactor.

In the prior art, MOS type varactors are well known. In these structures, an equipotential conductive plate is insulatively spaced from a semiconductor body such that the capacitance between the plate and body is a function of the bias between them. When sufficient voltage is applied to the conductive plate to cause an inversion layer or depletion region within the semiconductor body, the capacitance $C_D$ of the depletion layer is provided in series with the capacitance $C_{OX}$ of the insulative or dielectric layer which spaces the plate from the body; where $C_D$ and $C_{OX}$ are defined as capacitances for unity of surface.

Further increase in voltage beyond the minimum inversion voltage, or inversion threshold voltage, only increases the inversion layer capacitance to a very limited extent, such that the overall capacitance of the unit varies essentially between two values; that is, between capacitance $C_{OX}$ and the series capacitance of $C_{OX}$ and $C_D$ called inversion capacitance $C_I$. Moreover, the change in capacitance between these values is generally abrupt. Hence, these units have very limited tuning when operated solely in the inversion mode, and discontinuous tuning when operated through both modes.

It is an object of this invention to provide a varactor having tuning continuity.

It is another object of this invention to provide an MOS varactor utilizing planar expansion of the inversion layer.

It is a further object of this invention to provide a varactor having substantially constant output voltage.

It is a still further object of this invention to provide an MOS varactor having a tuning curve of selective shape.

These and other objects of the invention will become apparent upon consideration of the following specification and claims taken in conjunction with the drawing.

Broadly, a tunable varactor provided in accordance with the invention comprises a body of semiconductor material of one conductivity type, a layer of insulative material disposed on the surface of said body, a layer of resistive material overlying said insulative layer, a pair of spaced contacts in substantially ohmic connection to said resistive layer, and means to apply a variable voltage gradient across said resistive layer between said spaced contacts such that the capacitance between said resistive layer and body is continuously tunable in accordance with said variable voltage.

DESCRIPTION OF THE PREFERRED EMBODIMENT

Figure 1:
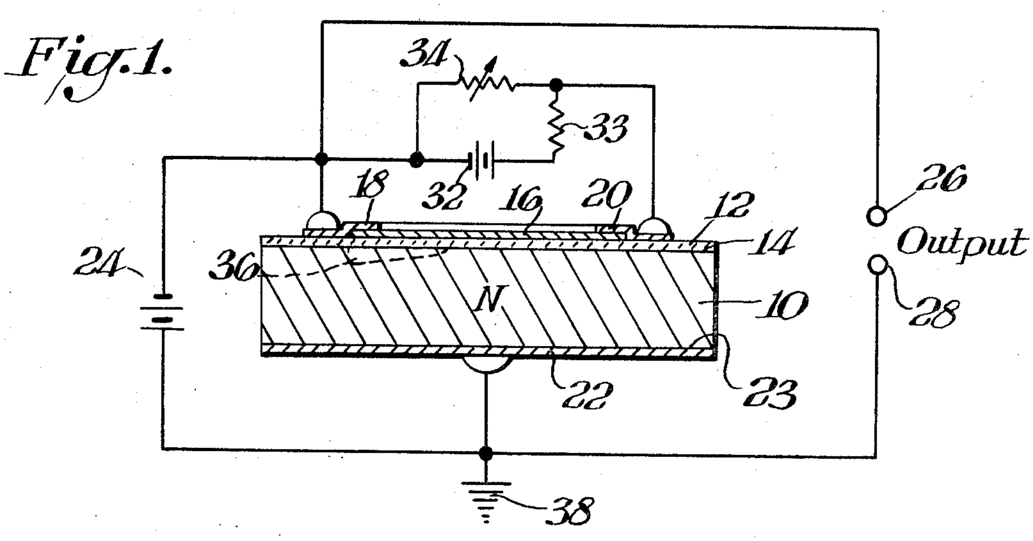
FIG. 1 is a view in section of a varactor provided in accordance with the invention.

FIG. 1 shows a body 10 of conventional semiconductive material such as N-type silicon or the like. A thin insulative layer 12, such as silicon dioxide or the like, is disposed on the upper surface 14 of body 10. A resistive layer, or plate 16 of uniform width overlies layer 12 and is provided with a pair of contacts 18 and 20, disposed at its extremities. The unit is completed by a contact element 22 which is provided in substantially ohmic connection to the bottom surface 23 of body 10.

The unit is operated as a variable capacitor by providing a bias voltage, for example a battery 24, between a first contact 18 of plate 16 and body contact 22. Output terminals 26 and 28 are also provided in connection to the first contact 18 and body contact 22, respectively. Finally, a variable voltage gradient is applied across the length of plate 16 by means of, for example, battery 32, resistor 33 and variable resistor 34.

Battery 24 provides a sufficiently negative voltage to contact 18 so as to insure an inversion layer 36 at one point within body 10. Battery 32 provides a positive voltage to the other end of plate 16 at contact 20 such that a small current flow passes from contact 20 to contact 18. This in turn, causes a voltage gradient along the length of plate 16, and subsequently a similar distribution of the voltage difference between plate positions and the underlying surface portion of body 10.

Hence, the inversion layer extends beneath plate 16 only a short distance from contact 18 to a point where inversion threshold potential exists. Then, variation in the voltage applied to contact 20, for example, by varying resistor 34, will shift this threshold point and longitudinally expand or contract the inversion layer so as to tune the capacitance registered at output terminals 26, 28.

Stated otherwise, the resistive plate assumes different potential values at different points along the length between its contacts. If the plate contacts are operated at potentials which are respectively more and less than the potential applied to the body, then part of the semiconductive body, below the plate, will have an inversion layer and part of it will not.

Hence, part of the body surface will have a small capacitance per unit area $C_I$ (where the inversion layer exists) and the other part will have a large capacitance per unit area $C_{OXN}$ (where no inversion layer exists). The ratio of these two parts of the surface can be changed at will by increasing or decreasing the potential gradient applied across the plate while keeping the body potential and one plate potential constant.

In the capacitance per unit area contributed by the oxide over the depletion layer is called $C_{OXD}$ and the capacitance per unit area contributed by the oxide over no depletion layer is called $C_{OXN}$ then the overall capacitance $C_T$ results from $C_{OXN}$ in parallel with $C_I$ which is derived from $C_{OXD}$ and $C_D$ in series. That is, output terminals 26, 28 provide a total capacitance $C_T$ which is the sum of the following two terms:

1. The inversion layer capacitance $C_I$ which is the reciprocal of the sum of the reciprocals of the oxide capacitance in the depletion area $C_{OXD}$ and the depletion layer capacitance $C_D$, multiplied by the area of the inversion layer;
2. The oxide capacitance outside the depletion area $C_{OXN}$ times that area underlying the resistive plate which does not contain an inversion layer.

Since $C_I$ will always be smaller than the oxide capacitance and since the inversion area decreases with an increase in the positive voltage at contact 20, the output capacitance $C_T$ increases with increased voltage on contact 20.

Consequently, the structure provides a continuous, precisely controlled tuning curve from a minimum $C_T$ (with maximum length inversion area) to a value close or equal to the overall oxide capacitance (no inversion layer). Advantageously, since the variable DC bias provided by battery 32 and resistors 33 and 34, are solely between the spaced plate contacts 18, 20 and thus independent of bias 24, the output voltage at terminals 26, 28 remains substantially constant throughout the tuning range of the unit.

Accordingly, the novel unit utilizes the planar expansion or contraction of the depletion layer to vary capacitance. Hence, the tuning curve can be tailored in accordance with plate area. For example, in the embodiment shown in FIG. 1, plate 16 is preferably an elongated thin metal layer having a uniform width throughout its length so that the inversion area will be inversionally proportional to the voltage difference between the plate contacts. The tuning curve, which is made up of oxide capacitance $C_{OXN}$ and inversion capacitance $C_I$ in parallel connection, will be substantially continuous and of wide range (depending upon plate area etc.) as contrasted to the discontinuous tuning and limited range of the prior art.

The unit is constructed for example by first forming a semiconductive body of silicon or the like having a conductivity of approximately $10^{16}$ atoms/cm.$^3$. Thereafter a silicon dioxide is thermally grown over the surface of the body to a thickness of 1,000 Angstroms. Then a resistive strip of nichrome, cermet or other material having a substantially high resistivity and presenting, for example, a surface resistance of 1,000 ohms per square, is deposited upon the oxide coating overlying the upper surface of the body.

For example, a resistive plate 6 mils long and 1 mil wide was employed such that the plate had an overall resistance of 6,000 ohms. Substantially ohmic contacts of aluminum or the like were then applied to opposite ends of layer 16 and a gold layer 22 then deposited on the clean undersurface of the body. For example, at lower surface 23 of body 10, the oxide coating was removed by etching or the like. Gold or the like was then evaporated on the cleaned surface and alloyed at the eutectic temperature of the gold-silicon system to provide a substantially ohmic contact to the body.

The unit is operated by applying a negative voltage, for example −2 volts between one plate contact (contact 18, for example) with respect to the body contact, and a variable positive voltage, for example 0–6 volts, to the other plate contact, that is contact 20. Then assuming that inversion threshold voltage is approximately zero volts, the inversion layer will vary from full plate length with zero voltage on contact 20 to one-fourth the plate length with +6 volts on contact 20.

Figure 2:
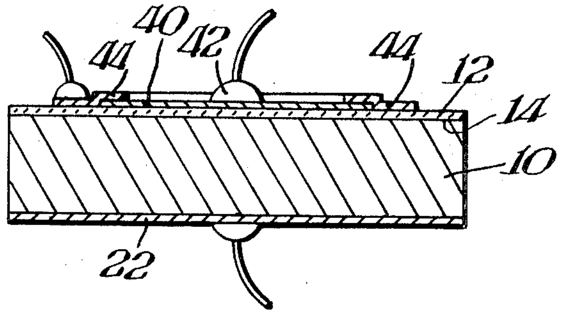
FIG. 2 is a view in section of a further embodiment having a circular geometry.
Figure 3:
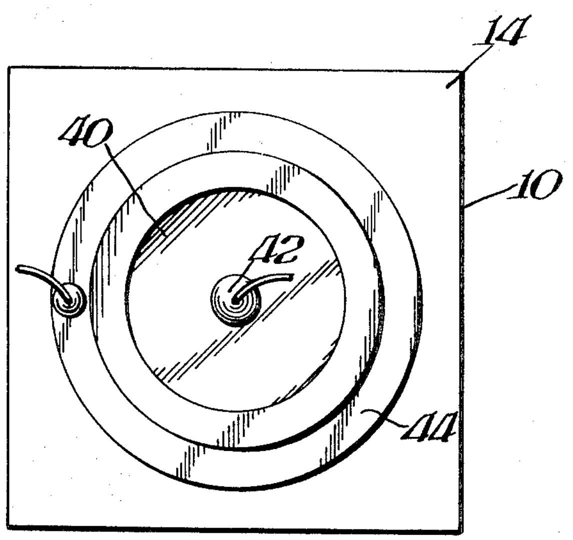
FIG. 3 is a plan view of the embodiment shown in FIG. 2.

As previously indicated, the resistive plate can be geometrically tailored to vary the tuning curve in accordance with the desired application. The plate may be on nonuniform width, that is, tapered or for example as shown in FIGS. 2 and 3, a resistive plate 40 can be made in a circular geometry. In this case a circular contact 44 extends around its full perimeter. Herein, variation in voltage between center contact 42 and outer contact 44 provides a change in the inversion layer area which originates a tuning curve different from that belonging to the embodiment of FIG. 1.

Many different materials can be utilized for the elements of the structure and other geometries may be employed to provide special tuning curves. Hence, many different embodiments are possible without departing from the spirit and scope of the invention herein, and it should be understood that the invention is not to be limited except as in the appended claims.

What I claim is:

1. A varactor comprising a body of monocrystalline semiconductive material of one conductivity type, a layer of insulative material disposed on the surface of said body, a layer of resistive material overlying said insulative layer, a pair of spaced contacts in substantially ohmic contact to said resistive layer, output terminals in connection to a first of said pair of contacts and said body, and variable voltage means to apply a voltage gradient across said resistive layer between said contacts for producing an inversion region of variable planar area within said semiconductive body whereby the capacitance between said output terminals is continuously tunable in accordance with said variable voltage.

2. The varactor of claim 1 including means for biasing the first of said spaced contact pair with respect to said body at a potential of polarity and magnitude for producing an inversion layer within said body, and the second of said contacts being biased at a potential of polarity and magnitude as to exclude an inversion layer.

3. The varactor of claim 1 wherein said resistive layer is a circular configuration having one of said spaced contacts at the center and the other at the outer periphery thereof.

4. The varactor of claim 1 wherein said resistive layer is an elongated layer having contacts spaced apart on the longitudinal axis of said layer.

5. The varactor of claim 4 wherein said layer is of uniform width.

6. The varactor of claim 4 wherein said body is of substantially monocrystalline silicon of one conductivity type, said insulative layer is a compound of said body, and said resistive layer has a surface resistivity of approximately 1,000 ohms per square.